(12) United States Patent
Perruchot et al.

(10) Patent No.: US 7,993,949 B2
(45) Date of Patent: Aug. 9, 2011

(54) HETEROGENEOUS SUBSTRATE INCLUDING A SACRIFICIAL LAYER, AND A METHOD OF FABRICATING IT

(75) Inventors: François Perruchot, Grenoble (FR); Bernard Diem, Echirolles (FR); Vincent Larrey, La Murette (FR); Laurent Clavelier, Grenoble (FR); Emmanuel Defay, Vorepe (FR)

(73) Assignee: Commissariat a l'Energie Atomique, Paris (FR)

( * ) Notice: Subject to any disclaimer, the term of this patent is extended or adjusted under 35 U.S.C. 154(b) by 82 days.

(21) Appl. No.: 12/488,854

(22) Filed: Jun. 22, 2009

(65) Prior Publication Data
US 2009/0325335 A1 Dec. 31, 2009

(30) Foreign Application Priority Data
Jun. 23, 2008 (FR) ...................................... 08/03496

(51) Int. Cl.
*H01L 21/02* (2006.01)
(52) U.S. Cl. ...... 438/50; 438/53; 438/752; 257/E21.002; 257/E21.214
(58) Field of Classification Search .................. 438/50, 438/53, 752; 257/E21.002, E21.214
See application file for complete search history.

(56) References Cited

U.S. PATENT DOCUMENTS

| 7,625,772 | B2* | 12/2009 | Casset et al. ...................... 438/50 |
| 7,906,439 | B2* | 3/2011 | Perruchot et al. .............. 438/752 |
| 2009/0206422 | A1* | 8/2009 | Illing et al. ..................... 257/419 |

FOREIGN PATENT DOCUMENTS
DE    10 2006 032195 A1    1/2008
EP       1 905 734 A         4/2008

OTHER PUBLICATIONS
International Search Report for French Application No. 08/03496, filed Jun. 23, 2008.

* cited by examiner

*Primary Examiner* — Matthew Smith
*Assistant Examiner* — Christine Enad
(74) *Attorney, Agent, or Firm* — Alston & Bird LLP

(57) ABSTRACT

The invention relates to a method of making a component from a heterogeneous substrate comprising first and second portions in at least one monocrystalline material, and a sacrificial layer constituted by at least one stack of at least one layer of monocrystalline Si situated between two layers of monocrystalline SiGe, the stack being disposed between said first and second portions of monocrystalline material, wherein the method consists in etching said stack by making:
  e) at least one opening in the first and/or second portion and the first and/or second layer of SiGe so as to reach the layer of Si; and
  f) eliminating all or part of the layer of Si.

11 Claims, 7 Drawing Sheets

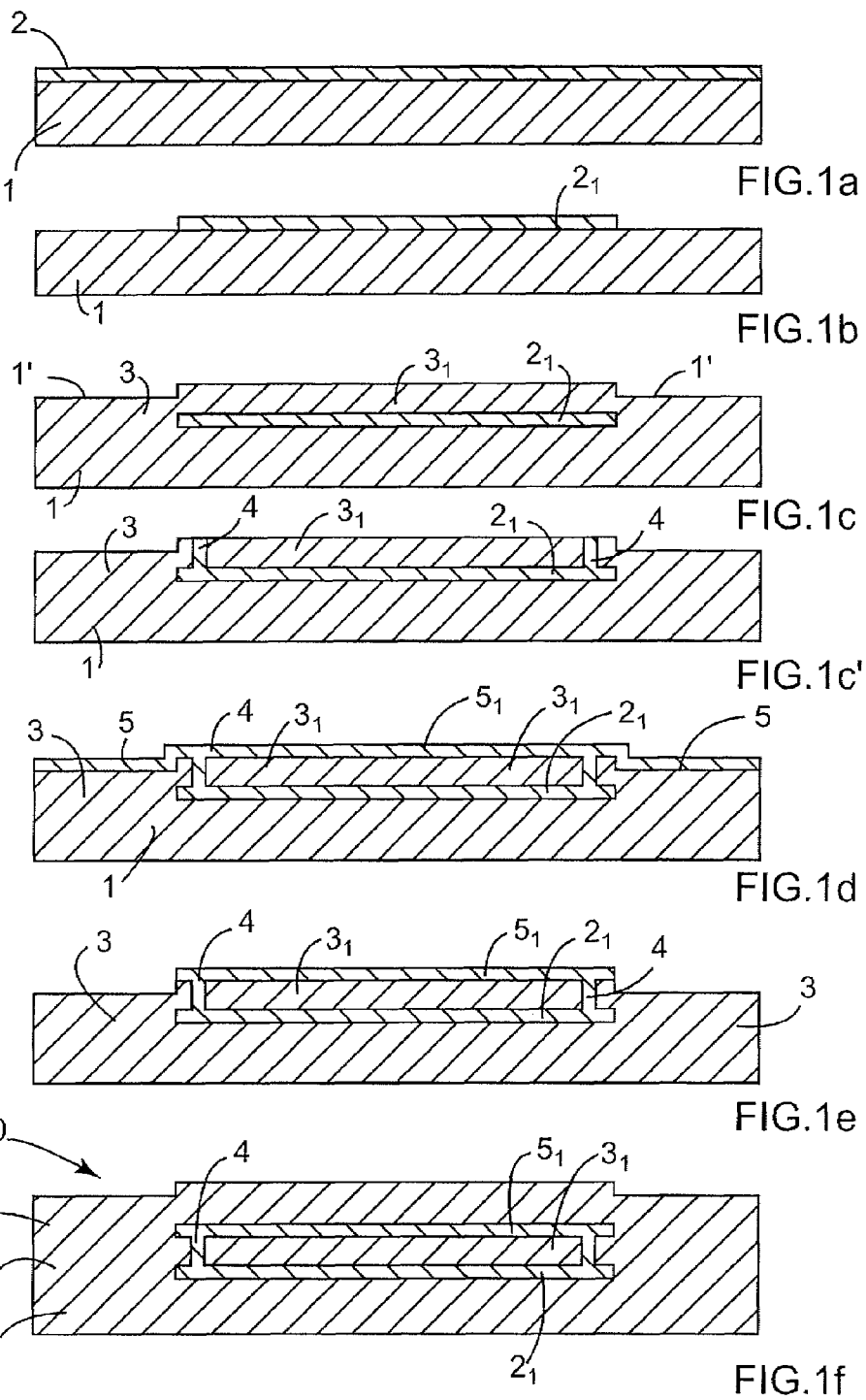

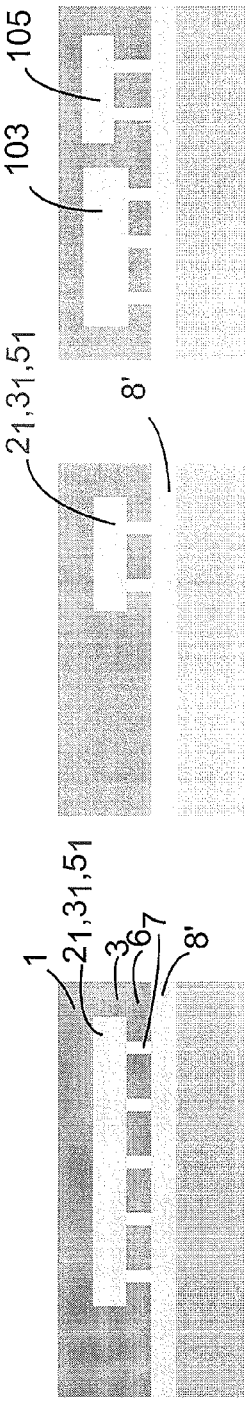
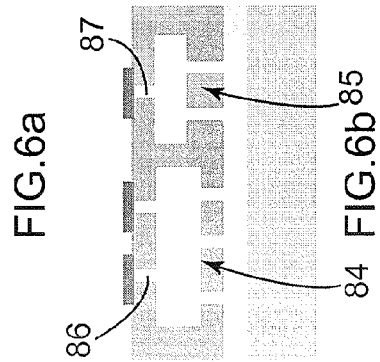
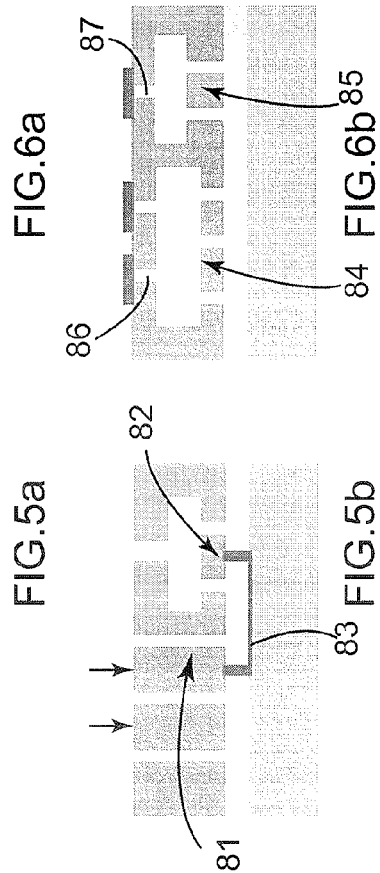
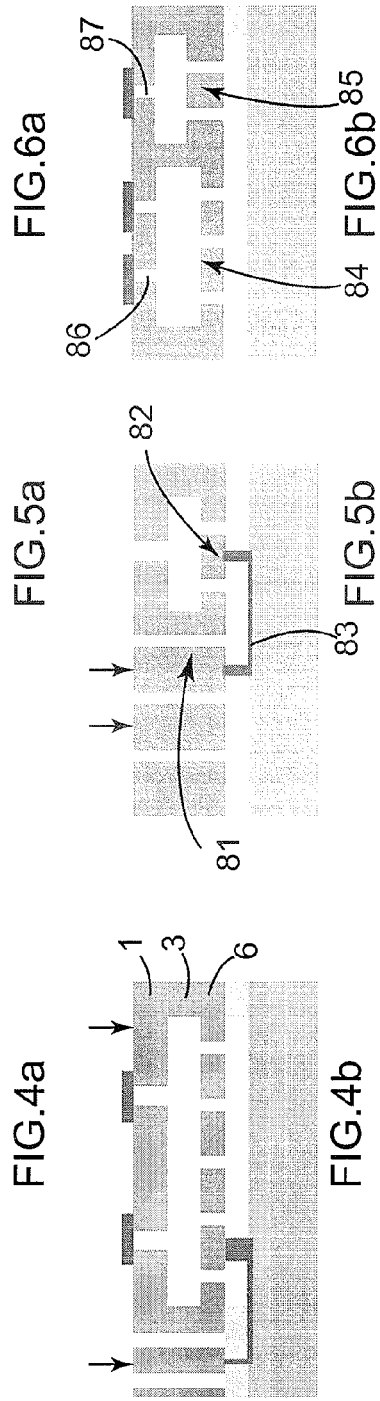
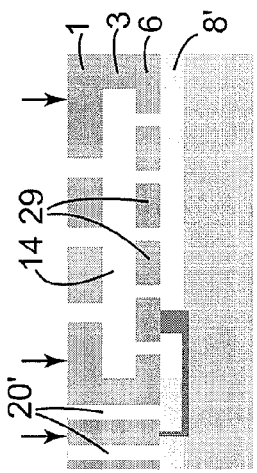

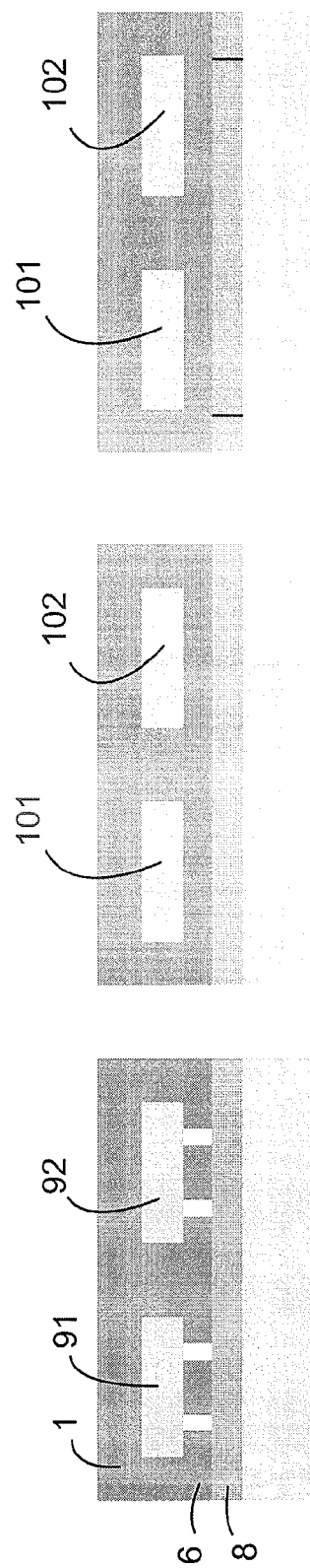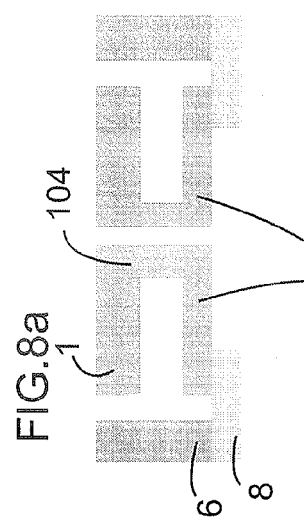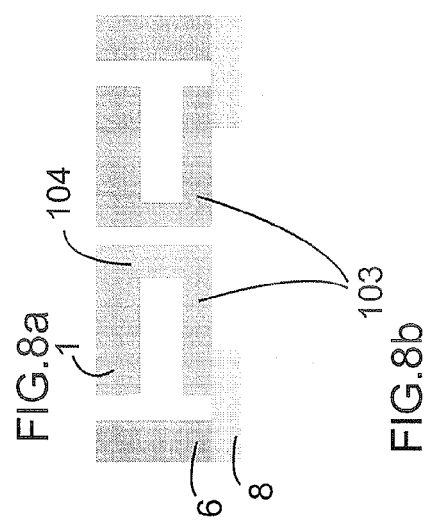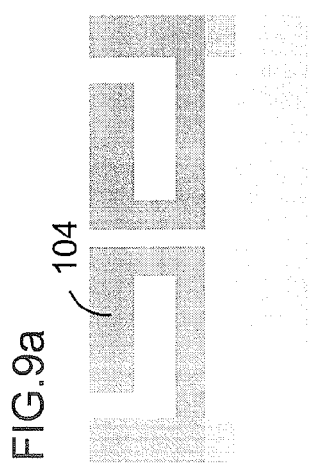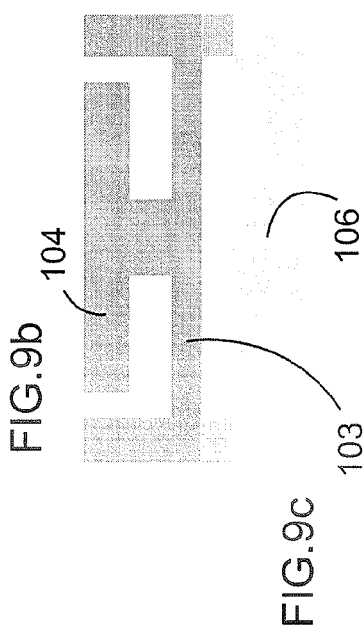
FIG.7a
FIG.7b
FIG.8a
FIG.8b
FIG.9a
FIG.9b
FIG.9c

HETEROGENEOUS SUBSTRATE INCLUDING A SACRIFICIAL LAYER, AND A METHOD OF FABRICATING IT

FIELD OF THE INVENTION

The present invention relates to a heterogeneous substrate including a sacrificial layer, and to a method of fabricating it. The substrate is intended specifically for making a microelectromechanical system (MEMS).

BACKGROUND OF THE INVENTION

So-called surface technologies (as contrasted with bulk technologies) enable the size of electromechanical structures that are made on silicon to be reduced. These technologies rely on using a stack of at least three layers: a mechanical layer (thickness typically 0.1 micrometer ($\mu m$) to 100 $\mu m$); a sacrificial layer (thickness typically 0.1 $\mu m$ to 5 $\mu m$); and a support (thickness typically 10 $\mu m$ to 1000 $\mu m$). Selective chemical etching of the sacrificial layer makes it possible to form active structures in the mechanical layer that are locally independent of the support. The non-etched zones of the sacrificial layer serve to make so-called "anchor" zones whereby the mechanical structure is connected to the support.

Any particular given method is characterized by selecting a pair of materials for constituting the mechanical layer and the sacrificial layer, and by selecting the method used for associating them with the support. The choice of method depends on criteria that differ depending on the type of component made, but in order to have a method that is flexible and suitable for adapting to a wide range of requirements, the main technological criteria retained are as follows:

- the quality of the mechanical layer, firstly the stability of its mechanical properties, but also the precision with which its dimensions can be controlled, and in particular its thickness;
- the possibility of controlling the lateral dimensions of anchor zones by inserting, in the sacrificial layer, zones that are not attacked by the chemical etching so as to avoid being dependent on controlling etching by duration, where such control is sensitive to the shape of the structure;
- the possibility of having one or more levels of electrical interconnection above and/or below the mechanical layer, suitable for acting as electrodes, where necessary;
- compatibility with adding a silicon cap, in particular for inertial structures; and
- the possibility of having distinct thicknesses of silicon in a single component.

The family of methods in the most widespread use rely on the silicon (mechanical layer) and silica (sacrificial layer) materials pair associated with selective etching of the silica with HF (in the liquid or the vapor phase). This family forms part of silicon-on-insulator (SOI) MEMS technology.

The simplest SOI-MEMS methods make use of two layers of $SiO_2$ and Si made by successive deposits of material, e.g. by plasma-enhanced chemical vapor deposition (PECVD) or by low pressure chemical vapor deposition (LPCVD) on a silicon support (solid silicon substrate). These methods are advantageous, because:

- the thickness of the mechanical layer is controlled by the length of time the silicon layer is deposited;
- the anchor zones are very well controlled since it is possible to use the mechanical layer directly by locally etching the oxide layer prior to depositing the silicon; and
- it is possible to make interconnections at different levels.

Nevertheless, the silicon constituting the mechanical layer deposited on the oxide is polycrystalline silicon, which makes it more difficult to control its mechanical qualities (controlling level of stresses, stability, . . . ), and puts a limit on the thickness that can be obtained.

Known improvements to those methods make it possible to use monocrystalline silicon as the mechanical layer, thus obtaining mechanical properties that are considered as being better, and also obtaining a range of accessible thicknesses that is greater.

Three major families of known methods of making MEMS out of monocrystalline silicon using SOI-MEMS technology may be mentioned, which families differ by the method used for making the substrate that includes the complete stack:

1) The starting substrate is an SOI substrate having a fine layer of Si of the microelectronic type and of controlled thickness (typically of the order of 100 nanometers (nm)), e.g. made using the so-called "Smart Cut" (registered trademark) cleaving technique. The $SiO_2$ layer provides insulation relative to the substrate and it is used as a sacrificial layer, with the fine silicon layer serving as a basis for epitaxial growth of silicon, thereby enabling a mechanical layer to be obtained that is made of monocrystalline material.

It is also known to make interconnection levels over a mechanical layer and anchors out of SiN or polycrystalline Si as described in the article "Polysilicon packaging and a new anchoring technology for thick SOI-MEMS—dynamic response model and application to over-damped inertial sensors" by B. Diem et al. (13th International Conference on Solid State Sensors, Actuators, and Microsensors, Seoul, Jun. 5-9, 2005, pp. 527-530).

2) The initial substrate is a silicon substrate having an oxide layer. The mechanical layer is made by bonding a second substrate of thick silicon which is subsequently thinned by rectification and polishing (cf. PCT application WO 2006/035031). In that method, the sacrificial layer is used as a bonding layer and the quality of bonding is critical since it must guarantee that the chemical etching is uniform. Implementing anchor zones in the sacrificial layer prior to bonding is possible, but that requires substrate bonding to be performed with heterogeneous surfaces.

3) The initial substrate is a thick silicon substrate on which there are deposited the sacrificial oxide layer and then a functionalization multilayer of SiN associated with polycrystalline Si, and finally a final bonding layer of polycrystalline Si. This initial stack is bonded onto a second silicon substrate that acts as a support. Thereafter, the thick base substrate is thinned by rectification and polishing to provide a mechanical layer that is used for the electromechanical system (cf. the article "Capacitive accelerometer with high aspect ratio single crystalline silicon microstructure using the SOI structure with polysilicon-based interconnect technique", by T. Yamamoto et al., published in MEMS 2000, the 13th International Annual Conference, Jan. 23-27 2000, Miyazaki, Japan, pp. 514-519). The proposed method makes it possible to provide anchor zones of polycrystalline Si, interconnection layers, and buried electrodes, and the bonding layer is distinct from the sacrificial layer, which means that the quality of bonding is less critical, since it then has mechanical functions only.

With inertial structures, it is necessary to provide a cap over the active structure both for the purpose of protecting it and also for ensuring that the atmosphere in which the structure is located is controlled in terms of pressure and composition. The cap must not give rise directly or indirectly to stresses on the component (in particular when the base substrate is thinned so as to reduce the total thickness of the device).

A first solution is to place a cutout MEMS structure in a package. That non-collective technology significantly increases the cost of the component and also increases its total volume.

Known technologies for providing protection over MEMS structures in collective manner are of two types:

either sealing a wafer of silicon having cavities over the MEMS structures. By way of example this is proposed in the method of sealing with glass frit and a contact pass under the structure (as described for example in U.S. Pat. No. 6,391,673);

or making a cap as a thin layer. For example, in above method 1), it is possible to make a cap out of polycrystalline Si on top of the MEMS structure, e.g. as described in the above-mentioned article by B. Diem.

Solutions that require a wafer of silicon to be fitted make use of a third substrate. Sealing technology requires a bonding area that is sufficient to provide mechanical strength, thereby increasing the total area of the component.

Solutions exist involving fitting a silicon cap while providing an electrical connection (reference: AuSn on a component: Q. Wang et al., Application of Au—Sn eutectic bonding in hermetic radio-frequency microelectromechanical system wafer level packaging, Journal of Electronic Materials, Vol. 35, No. 3, 2006). For the time being, those technologies are usable industrially only at component scale, and in addition the connection is made with the help of a metal alloy that is complex to provide.

The solution associated with above method 1) relies on using a deposit of polycrystalline Si, and it enables contacts to be transferred via the cap. However the nature of the deposit used requires stress to be monitored, which is difficult to do industrially. Such monitoring is particularly required when the support is thinned so as to reduce the total thickness of the component. In addition, the thickness of the cap is limited to about ten micrometers, making it difficult to use the face of the cap for three-dimensional integration technologies.

In methods of the SOI type that use a monocrystalline active layer, it is not presently possible to structure the mechanical layer in the third dimension.

The main known solutions for making MEMS on silicon rely on using a sacrificial layer of oxide. The advantage of this choice is the excellent selectivity of etching oxide and stopping on silicon, which is the material used most widely as the mechanical layer. However it is not possible to grow a monocrystalline material epitaxially on such a layer, thereby making it necessary to find alternative methods for making the assembly comprising the support, the sacrificial layer, and the mechanical layer when it is desired to obtain a mechanical layer that is made of monocrystalline material. The oxide sacrificial layer is not a good candidate for structuring the mechanical layer by including a sacrificial layer therein.

A known solution for making a sacrificial layer compatible with growing silicon epitaxially consists in using SiGe as the sacrificial layer, since it is possible to grow SiGe epitaxially on silicon and to grow silicon epitaxially on SiGe. The limitation of that solution is the thickness of SiGe that can be obtained without giving rise to high levels of stress in the subsequently deposited layer of monocrystalline silicon. In addition, the selectivity of etching SiGe and stopping on Si is only medium. Another known solution consists in using porous Si. Porous Si can be made on the surface of a silicon substrate without any constraint of limiting thickness, and it is subsequently possible to grow a new layer of Si epitaxially (see article by P. Steiner, A. Richter, and W. Lang, "Using porous silicon as a sacrificial layer", J. Micromech. Microeng. 3 (1993) 3236). The limit on that solution is the relatively poor selectivity of etching porous Si and stopping on Si.

OBJECT AND SUMMARY OF THE INVENTION

The idea on which the invention is based is to overcome at least one of the limitations of the prior art by proposing a substrate having a new sacrificial layer compatible with growing silicon or some other monocrystalline material epitaxially, that is not limited to small thicknesses, and that provides good selectivity for at least one chemical etching step, at least with silicon.

The invention thus relates to a heterogeneous substrate for use in particular for making an electromechanical system, the substrate comprising first and second portions made of at least one monocrystalline material, and including a sacrificial layer constituted by a stack having at least one layer of monocrystalline Si situated between two layers of monocrystalline SiGe, the stack being placed between said first and second portions of monocrystalline material.

This makes it possible to make a sacrificial layer that can be etched with good selectivity at least relative to silicon, and that is compatible with growing silicon or some other monocrystalline material epitaxially, possibly from transition layers, including for thicknesses greater than one micrometer, and making it possible in particular to make three-dimensional structures in a mechanical layer of monocrystalline material.

As mentioned above, the monocrystalline material may be silicon being used for its mechanical properties, however it is also advantageous to be able to make other materials in monocrystalline form so as to obtain, including at small thickness, physical properties that are close to the properties of the bulk monocrystal. This applies for example to ferroelectric oxides such as lead zirconate titanate (PZT), which can be made by being grown epitaxially from a transition layer made of monocrystalline silicon, the resulting layer of PZT having piezoelectric properties that are potentially better than those of amorphous or polycrystalline films formed by deposition or a sol-gel technique (see the article "Epitaxial growth of $Pb(Zr_{0.2}Ti_{0.8})O_3$ on Si and its nanoscale piezoelectric properties", by A. Lin et al., in Applied Physics Letters, Vol. 78-14 of Apr. 2, 2001). The monocrystalline mechanical layer may thus comprise a multilayer structure of different monocrystalline materials.

Since the first and second portions are separated by a sacrificial layer made from a stack constituted by a sacrificial monocrystalline Si layer sandwiched between two layers of monocrystalline SiGe, the layer of Si serves to adjust the thickness of the sacrificial layer and the layers of SiGe serve to stop etching when releasing an electromechanical system, and they do so with very good selectivity. The layers of SiGe may subsequently be etched quickly with stopping on Si, for example, the selectivity then being sufficient.

The sacrificial layer may cover all of the surface of the substrate or it may be localized.

It is possible to make a plurality of sacrificial layers of this type in succession in a single substrate.

The first portion may be made of a monocrystalline material compatible with epitaxially growing monocrystalline SiGe (e.g. an Si substrate or a substrate based on Si comprising an added layer, e.g. by bonding another monocrystalline material).

The second portion may be made of at least one second monocrystalline material suitable for being grown epitaxially from monocrystalline SiGe (e.g. of Si, of SrTiO$_3$/PZT, or of SrTiO$_3$/SrRuO$_3$/PZT).

The stack may include at least one buried zone.

By way of example, the invention makes it possible to make a monocrystalline silicon cap for inertial structures, and also to integrate mechanical elements of different thicknesses in a single device, either side by side, e.g. to make sensors of differing sensitivities in the same component, or else one on the other, or indeed to make electrodes on top of the mechanical layer.

More precisely, the invention provides a method of making a component from a heterogeneous substrate comprising first and second portions in at least one monocrystalline material, and a sacrificial layer constituted by at least one stack of at least one layer of monocrystalline Si situated between two layers of monocrystalline SiGe, the stack being disposed between said first and second portions of monocrystalline material, wherein the method consists in etching said stack by making:

e) at least one opening in the first and/or second portion and the first and/or second layer of SiGe so as to reach the layer of Si; and f) eliminating all or part of the layer of Si.

Provision may be made for said first and second layers of SiGe to be removed.

Between steps e) and f), the etching step may include a step of protecting the flanks of the opening(s) by making a protective oxide layer.

The protective oxide layer may be made by thermal oxidation.

After step d), if the layers of SiGe do not cover the entire surface, the method may include planarizing the second epitaxial layer of monocrystalline material.

Said regions of monocrystalline SiGe may be obtained by being grown epitaxially on the complete surface, followed by selective chemical attack after masking so as to allow at least one said region to remain.

The first portion may be made of a first monocrystalline material that is compatible with epitaxially growing an SiGe material.

The second portion may be made of at least one second monocrystalline material suitable for being grown epitaxially from monocrystalline SiGe.

A said second monocrystalline material may be selected from: Si; SrTiO$_3$/PZT; and SrTiO$_3$/SrRuO$_3$/PZT.

Said stack may include at least one buried zone.

The above method may include the following steps of making the heterogeneous substrate from a substrate including a said first portion of monocrystalline material:

a) epitaxially growing a first layer of monocrystalline SiGe on said first portion;

b) epitaxially growing a layer of monocrystalline Si;

c) epitaxially growing a second layer of monocrystalline SiGe; and d) epitaxially growing said second portion of monocrystalline material, at least on the layer grown epitaxially in step c).

The first and/or the second layer of SiGe may be locally etched prior to performing the epitaxial growth in step b) and/or d).

After step b) and before c), trenches may be made in the layer of Si as far as the first layer of SiGe.

Advantageously, the first and/or layer of SiGe may have thickness lying in the range 40 nm to 150 nm.

It should be observed that the article "Local buried oxide technology for HV transistors integrated in CMOS" by E. Saarnilehto et al., published in Proceedings of the 19th International Symposium on Power Semiconductor Devices & ICs, May 27-30, 2007, Jeju, Korea, pp. 81-84, provides for growing Si and SiGe epitaxially in succession to make buried layers of SiGe, but that does not enable a buried cavity that has width and thickness that can be selected at will to be formed within a monocrystalline substrate, since only the SiGe layer is chemically etched in order to make the cavity. The thickness of the cavity is therefore limited to the thickness of the SiGe, and its width is limited by the selectivity of SiGe etching stopping on Si. Furthermore, French patent applications FR 2 876 219 and FR 2 876 220 provide for making buried regions of SiO$_2$, but they require bonding of an Si substrate.

Preferably, between steps b) and c) the method implements etching at least one trench to form a lateral etching stop.

The method of the invention makes it possible in particular to etch the sacrificial layer selectively by:

making at least one opening through one of the layers of monocrystalline material of the first (or second) portion of the heterogeneous substrate, said opening extending at least as far as a first (or second) region of monocrystalline SiGe, and preferably as far as the first epitaxially-grown layer of monocrystalline Si;

making or depositing a layer of protective material on the walls of at least one opening if the Si is not etched simultaneously with stopping on SiGe and the materials of the first (or second) portion; for example it is possible to use oxide as the protection layer if the portion including the openings comprises silicon, which oxide may be obtained by thermally oxidizing the silicon;

acting through the opening(s) to remove selectively at least a portion of the first epitaxially-grown layer of monocrystalline silicon that is situated between a first region of monocrystalline SiGe and the second layer of monocrystalline SiGe so as to form at least one released zone (and making a cavity in the context of the proposed method).

The above steps represent a method of releasing the sacrificial layer of SiGe, Si, and SiGe.

BRIEF DESCRIPTION OF THE DRAWINGS

Other characteristics and advantages of the invention appear better on reading the following description, given by way of non-limiting example, and with reference to the accompanying drawings, in which:

FIGS. 4 to 9 show the fabrication of six structures I to VI, namely I (FIGS. 4a to 4c), II (FIGS. 5a and 5b), III (FIGS. 6a and 6b), IV (FIGS. 7a and 7b), V (FIGS. 8a and 8b), and finally VI (FIGS. 9a to 9c).

MORE DETAILED DESCRIPTION

Figure 1G:
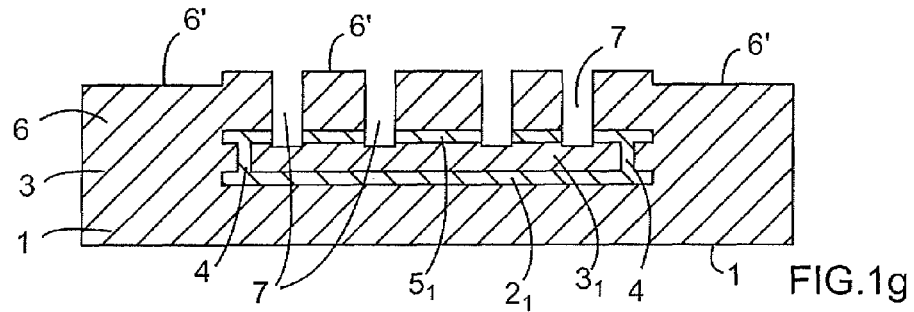
FIGS. 1a to 1o show a preferred method of the invention for making the heterogeneous substrate, and for making a MEMS.

The proposed sacrificial layer relies on the known possibility of selectively etching Si and stopping on SiGe, and of selectively etching SiGe and stopping on Si.

The selectivity of Si on SiGe is typically greater than 500, for example when using etching based on a mixture of $CF_4$, $CH_2F_2$, $N_2$, and $O_2$. This property makes it possible to make cavities with large form factors when etching Si and stopping on SiGe, and then etching SiGe.

Once the cavity has been etched in Si, the SiGe is in turn etched using a solution of $CF_4$ with selectivity greater than 100 (cf. the publication by S. Borel et al., "Control of selectivity between SiGe and Si in isotropic etching processes", Japanese Journal of Applied Physics, Vol. 43, No. 6B, 2004, pp. 3964-3966).

The proposed sacrificial layer is then made of three layers, a central layer of Si sandwiched between two layers of SiGe. The central layer of Si is used for defining the thickness of the sacrificial layer. This sacrificial layer is etched with etching stopping on the layers of SiGe. Thereafter, the layers of SiGe can be etched with etching stopping on silicon.

The making this sacrificial layer begins with epitaxially growing a layer 2 of monocrystalline SiGe on the surface of a substrate, e.g. a layer having thickness lying in the range 10 nm to 300 nm, typically 100 nm, with the Ge having a molar concentration lying in the range 20% to 60%, and the substrate having a surface layer 1 of a monocrystalline material compatible with epitaxially growing silicon, i.e. having a very similar crystal lattice (FIG. 1a).

In particular, it is possible to use a silicon substrate, or an SOI substrate.

The SiGe layer 2 is etched locally to give one or more regions $2_1$ (FIG. 1b).

The choice of thickness of the layer 2 of SiGe and the choice of Ge concentration makes it possible on the remaining surface 1' of the substrate 1 and on the region(s) $2_1$ (FIG. 1c) to grow epitaxially a layer 3 of monocrystalline Si having one or more monocrystalline regions $3_1$, and of quality that is sufficient to ensure that the mechanical layer 6 of a MEMS that is subsequently grown epitaxially will have satisfactory properties.

FIG. 1c' shows an optional step of etching one or more trenches 4 in a region $3_1$ grown epitaxially on a region $2_1$, which trenches are to be used in making lateral etching stops. These trenches 4 may extend only as far as the SiGe region $2_1$, however it is preferable for them to pass through the region $2_1$. For structures that are relatively simple, it is possible to do without such trenches 4, with etching then stopping at the end of a given length of time that is adapted to the width desired for lateral etching.

Thereafter, a second layer 5 of monocrystalline SiGe is deposited on the surface (FIG. 1d) and it may then be etched to form one or more regions $5_1$ (as shown), the regions $5_1$ preferably having the same outline as the region(s) $2_1$ (FIG. 1e).

This operation is followed by epitaxially depositing a layer 6 made up of one or more monocrystalline materials, which layer is subsequently planarized, e.g. by chemical and mechanical polishing (CMP) if the SiGe layers do not cover the entire surface (FIG. 1f), thereby obtaining a composite monocrystalline substrate 30 having one or more regions $3_1$ of monocrystalline Si that are sandwiched between two regions $2_1$ and $5_1$ of monocrystalline SiGe, these regions themselves being included in an epitaxially-grown substrate 1, 3, 6 of monocrystalline Si. This planarizing step is optional, since the topology comes from the thickness of the two layers of SiGe (typically 20 nm to 50 nm) and not from the thickness of the intermediate layer of silicon (1 μm to several micrometers).

The resulting heterogeneous substrate 30 is thus a substrate of mechanical materials having a region of silicon that is defined by two parallel planes of SiGe that typically have a thickness of 40 nm to 150 nm (see below). The two parallel planes of SiGe enable this silicon region to be used as a sacrificial layer (sacrificial layer of Si in Si), since it is possible to etch the Si selectively, stopping on the SiGe with very good selectivity.

The description below gives an example of a method using the sacrificial layer of the invention for making mechanical layers out of mechanical silicon. Combined with another sacrificial layer made of $SiO_2$, it enables a solution to be offered enabling an incorporated cap to be made for inertial MEMS, for example.

Steps 1g) to 1k) concern making a MEMS system from the heterogeneous substrate 30, in which one and/or the other of the layers 1 and 6 may be used as a mechanical layer for a MEMS.

FIG. 1g shows trenches 7 being made, e.g. by etching using the deep reactive ion etching (DRIE) method through the epitaxial layer 6 of Si, and stopping after a layer $5_1$ of SiGe.

Figure 1H:
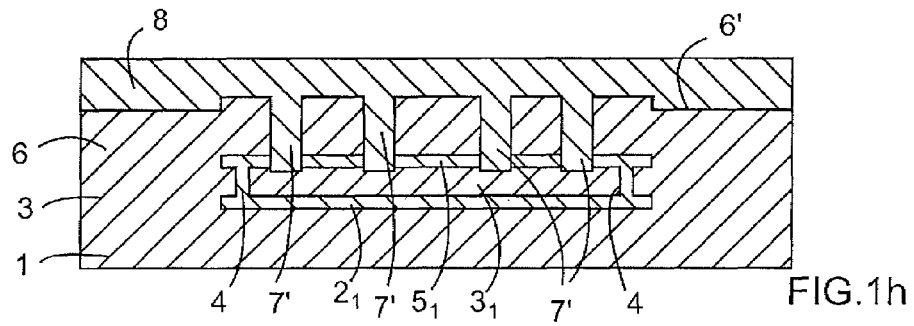

FIG. 1h shows depositing a sacrificial layer, e.g. of $SiO_2$, filling the trenches 7 and covering the surface 6' of the epitaxial layer 6 at 8. The filled trenches are referenced 7'. The sacrificial layer 8 may be planarized, e.g. by CMP. It serves for example as a sacrificial layer for releasing the MEMS.

When the thickness and the size of the trench is unsuitable for filling (deep thickness and wide trenches), it is also possible to make use of a layer that covers the trenches without filling them, e.g. by using phosphosilicate glass (PSG). This deposit may also serve as a sacrificial layer for releasing the MEMS, and there is no need to planarize it.

Figure 1I:
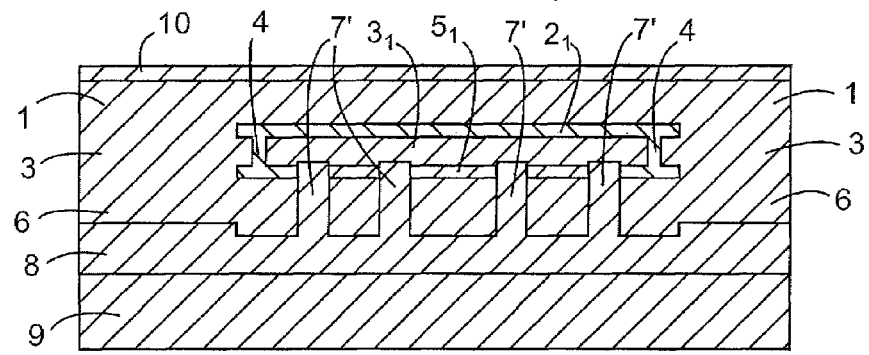

This sacrificial layer within a substrate as described above can be used for making a MEMS. A substrate 9 of Si is subsequently bonded, e.g. by molecular bonding, on the layer 8, and the substrate is turned over (FIG. 1i). It is also possible to use known techniques of functionalizing the sacrificial layer (cf. Yamamoto article), e.g. in order to make an electrical connection to the mechanical layer. Prior to bonding the substrate, it is therefore possible to make trenches in the sacrificial layer that are to be filled with doped polycrystalline silicon that also serves to make interconnection tracks. The assembly can be covered by a layer of nitride and then by a bonding layer of poly-Si or of oxide.

The layer 1 is optionally thinned to a thickness that depends on the function performed by the mechanical layer for the MEMS, and also limiting the time required subsequently for etching holes, and an oxide layer 10 is deposited or obtained by thermal oxidation of the silicon.

FIGS. 1j to 1n show the method of etching the sacrificial layer as described in the invention.

Figure 1J:
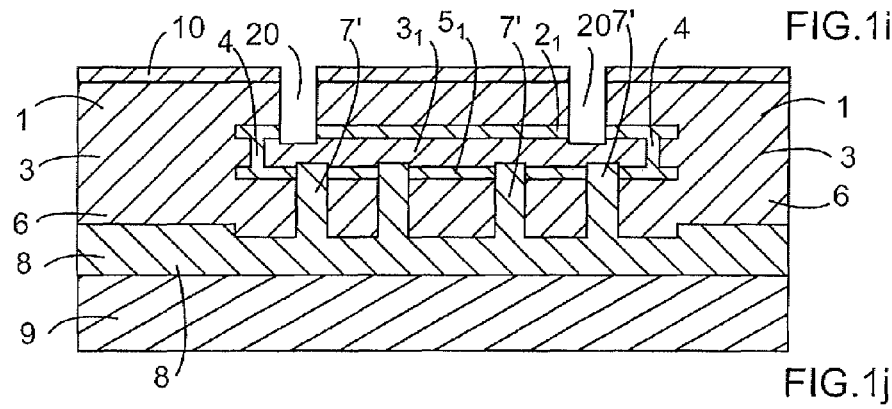
Figure 1K:
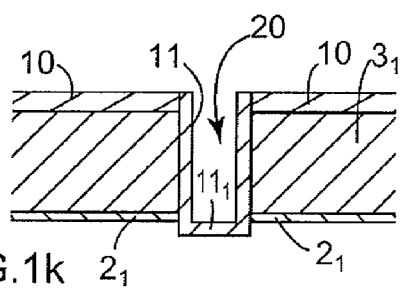

FIG. 1j shows holes 20 being made by etching the layer 1, e.g. by the DRIE method, which holes pass through one or more regions $2_1$ of SiGe.

The edges and the bottoms of the holes 20 are oxidized (FIG. 1k) to form a protective oxide layer 11, $11_1$ so as to enable the layers $2_1$, 3, and $5_1$ to be etched subsequently (FIG. 1j), in order to form at least one cavity 14.

Figure 1L:
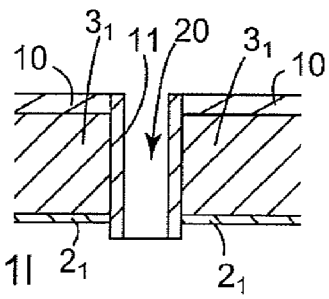

The oxide layer is etched at the bottoms of the holes. FIG. 1l shows the substrate after etching the oxide layer $11_1$ in the bottoms of the holes.

Figure 1M:
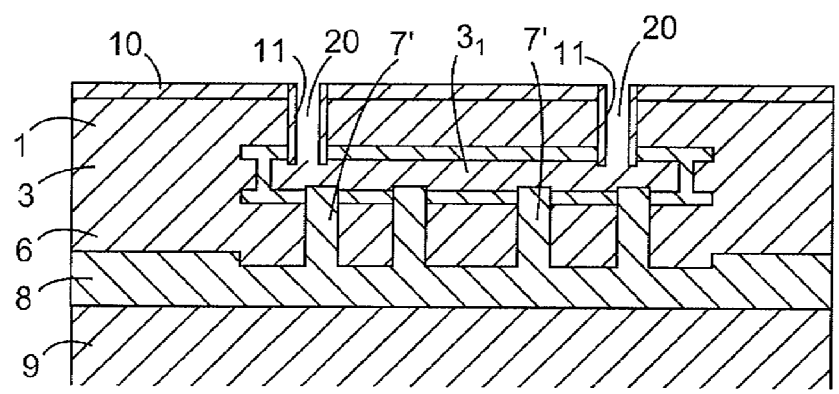

FIG. 1m shows selective etching by wet chemical etching or by reactive ion etching (RIE) of all or part of the layer of silicon $3_1$ through the release holes 20 so as to form a cavity 14. This etching stops on the layers $2_1$ and $5_1$ of SiGe and possibly on the lateral etching stop regions 4. In the absence of lateral etching stop trenches 4, the shape of the cavity 14 may be defined by the spatial configuration of the holes 20 and by the duration of etching.

Figure 1N:
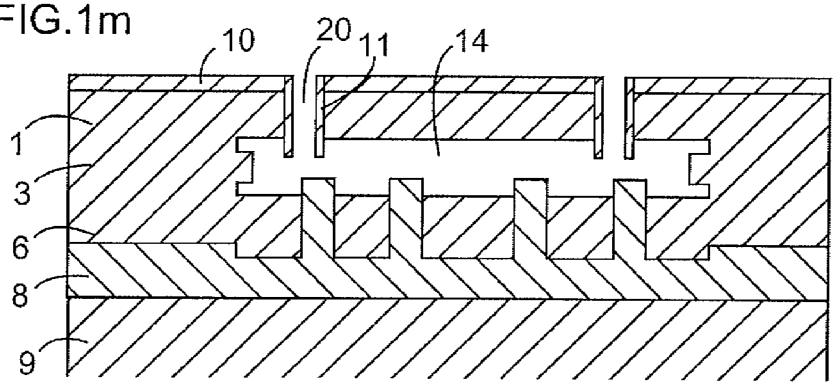

FIG. 1n shows selective etching (by RIE etching, cf. the document by S. Borel) of all or part of the layers $2_1$ and $5_1$ of SiGe, with etching stopping on silicon.

The method described using the heterogeneous substrate may be terminated by releasing the MEMS (FIG. 1o) by etching the oxide around the holes 20, the trenches 7', and the sacrificial layer 8 so as to give cleaned trenches 26 and cleaned regions 28 of the sacrificial layer, thereby releasing the active regions 29 of the mechanical layer 6.

FIGS. 1a to 1n relate to circumstances in which the cavity is defined completely by the SiGe walls. In another implementation, it is also possible not to etch the SiGe layers 2 and 5 so that they cover the entire substrate and to make do without any lateral etching stops. Under such circumstances, the cavity is defined by the two parallel planes of SiGe and by the positions of the holes 20 (isotropically attacking the silicon from the holes). This implementation makes it possible to avoid the steps of selectively etching the layers of SiGe and of making the etching stops. The optional step of planarizing the last epitaxial layer of silicon is also omitted. This implementation is therefore simpler and less expensive; however, shape is defined less accurately, but sufficiently when the shapes required for the cavities are simple. This applies in particular when making incorporated caps.

The method described using the heterogeneous substrate provided by the invention thus makes it possible to obtain a MEMS that is included in a monocrystalline SiGe substrate with the layer 1 acting as a cap. It may be covered by a layer of PSG that covers at least the trenches 11.

Advantage may be taken of the sacrificial layer 8 to make contact by making localized deposits of a conductive material (e.g. polycrystalline Si) in the trenches 7 between the steps of FIGS. 1g and 1h, and/or also for making reinforcing fillers, e.g. of silicon nitride by etching and deposition. Other trenches may be provided for making contacts.

The sacrificial layer 8 may also receive conductive areas, e.g. of polycrystalline Si, in order to make interconnections.

Figure 2A:
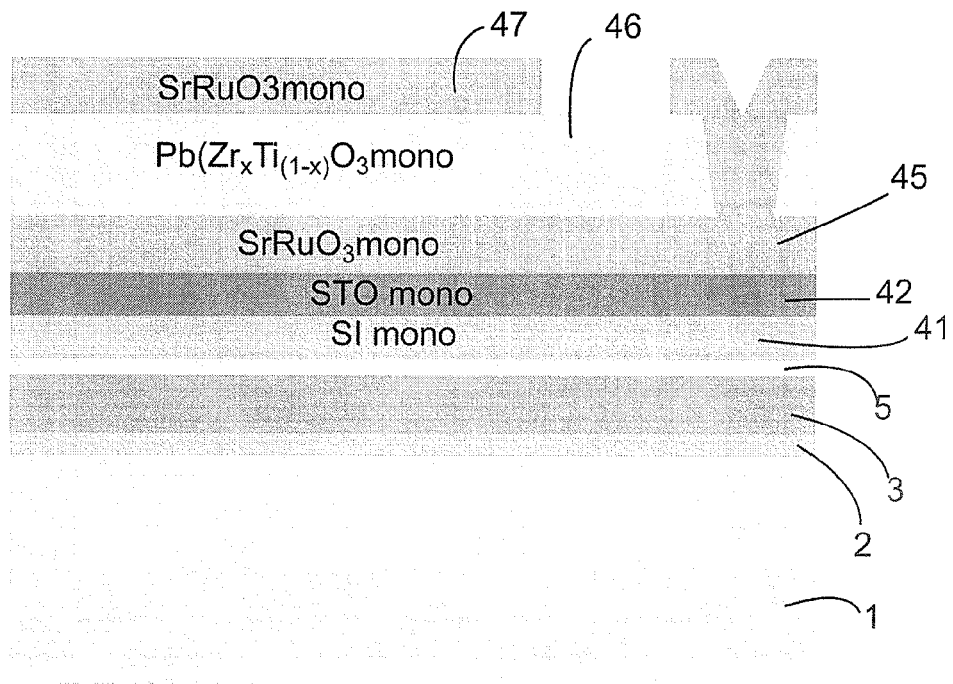
FIGS. 2a and 2b show another method in accordance with the invention and using a heterogeneous substrate including a piezoelectric layer.
Figure 2B:
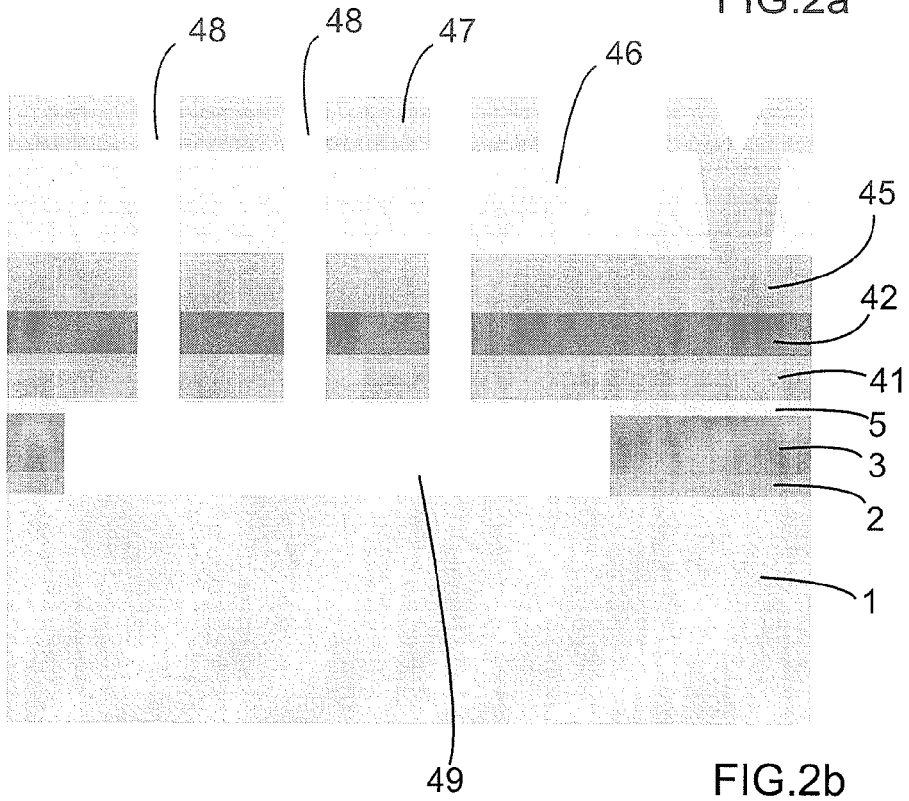

A second example described below with reference to FIGS. 2a and 2b shows the use of the sacrificial layer for a mechanical layer that is not made of monocrystalline silicon.

It is advantageous to be able to use certain thin-film materials in the form of a monocrystal when that enables physical properties to be obtained, including at small thickness, that are close to the properties of a bulk monocrystal, or in any event that are better than those obtained for the same material when in an amorphous or polycrystalline phase. In the family of perovskites, this applies for example to ferroelectric oxides such as PZT which can be grown epitaxially from a transition zone of $SrTiO_3$ on monocrystalline silicon with properties that are potentially better than those of amorphous or polycrystalline films obtained by deposition or by a sol-gel technique (above-mentioned article by A. Lin et al.).

Figure 1O:
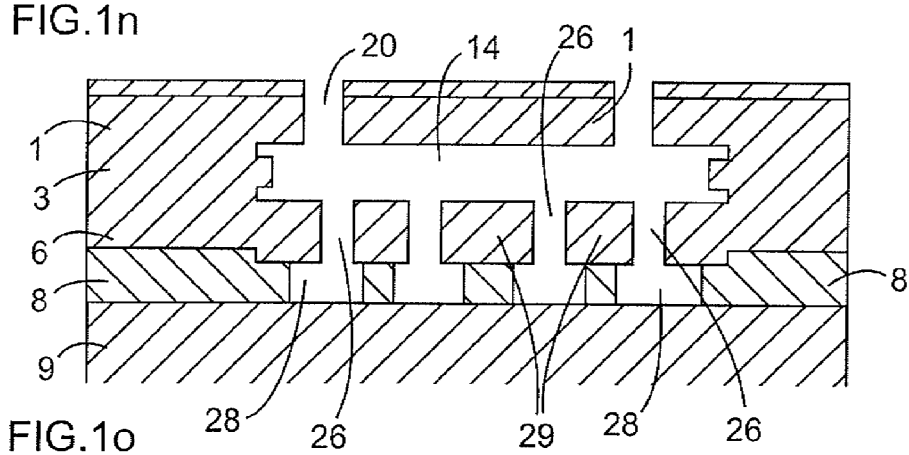

The sacrificial layer made up of a stack of SiGe, Si, and SiGe is made as in FIGS. 1a to 1o on a substrate of monocrystalline silicon. A transition layer made up of a layer of monocrystalline silicon and a monocrystalline layer 42 of STO and perovskite is grown epitaxially (where STO stands for $SrTiO_3$). The piezoelectric stack is made up of monocrystalline $SrRuO_3$ electrodes 45 associated with a piezoelectric layer 46 of PZT by means of a known method (above-mentioned article by A. Lin et al.) The local etching of the first electrode 45 and of the PZT layer 46 make it possible to use a second layer 47 of $SrRuO_3$ both for the first electrode and for making an electrical connection to the second electrode (FIG. 2a).

Openings are made by ion etching in the bulk of the resonant structure so as to release the piezoelectric structure locally, starting from the etching of the sacrificial layer performed in the manner described above (FIG. 2b) by forming a cavity 49 while also eliminating from the cavity the portions of SiGe, as shown, or else conserving them.

The component as obtained in this way is a bulk acoustic wave (BAW) resonator of the film bulk acoustic resonator (FBAR) type, i.e. it is made on a cavity.

It is also possible to use this sacrificial layer in more conventional methods using only a single sacrificial layer as shown in FIGS. 3a to 3d.

Figure 3A:
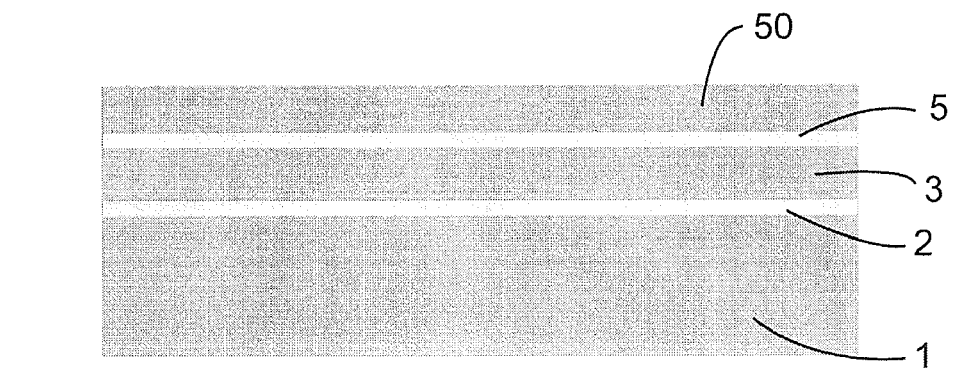
FIGS. 3a to 3d show another method in accordance with the invention including a mechanical layer associated with a sacrificial layer of the invention.
Figure 3B:
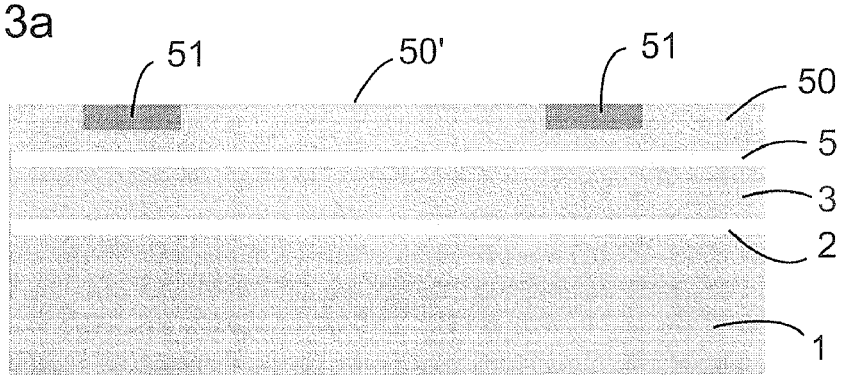
Figure 3C:
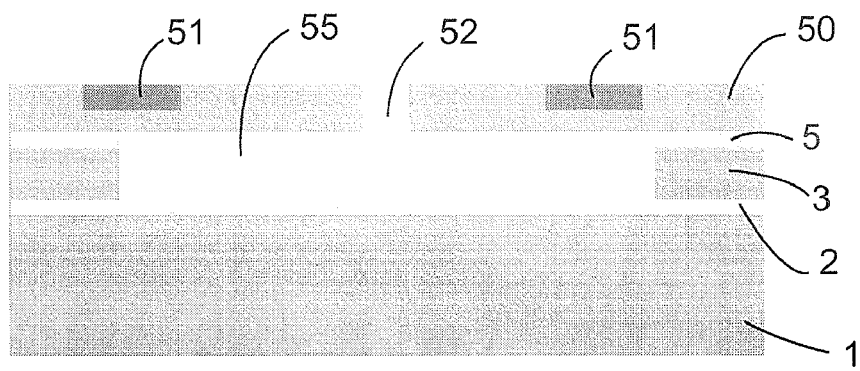
Figure 3D:
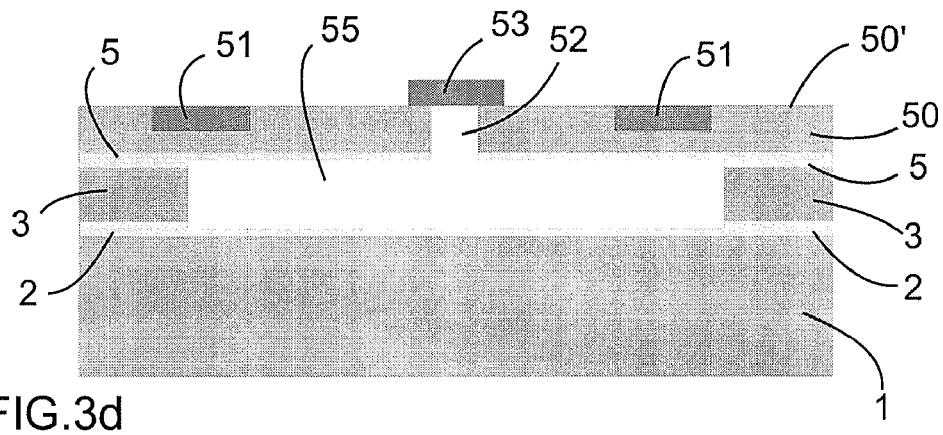

In this implementation of the invention, the sacrificial layer is made on a silicon substrate (FIG. 3a), so it is possible to make piezoresistive strain gauges 51 from zones 50' that are doped by surface implantation of the mechanical layer 50 (implantation type opposite from that of the mechanical layer) (FIG. 3b), and then releasing the mechanical layer in part from the etching of the sacrificial layer as described above (openings 52 made by DRIE) and then release in two steps) (FIG. 3c). After the openings 52 have been closed again, e.g. using a localized layer 53 of PSG, i.e. removing part of the Si of the layer 3 to define the cavity 55 (FIG. 3a) and then the SiGe of the layers 2 and 5 so as to terminate the cavity (FIG. 3a), the resulting device can be used as a pressure sensor with piezoresistive detection, having a diaphragm of monocrystalline silicon and not using the SOI substrate (FIG. 3d).

It is possible to combine the various approaches described in the two preceding implementations: a sacrificial layer as described for making a mechanical structure out of monocrystalline silicon (FIGS. 1a to 1o) or made out of one or more other materials (FIGS. 2a and 2b), the sacrificial layer of the invention being used as a main sacrificial layer (FIGS. 2a and 2b) or else as an additional layer for obtaining three-dimensional structuring of the mechanical layer (first example).

FIGS. 4 to 9 show the fabrication of six structures using the buried cavity principle. Each figure comprises the description of the associated heterogeneous substrate after the step of the method, and then at the end of the method. Each structure described corresponds to different given shapes for the etching zones, thereby illustrating the types of function that can be achieved.

I) Heterogeneous substrate (FIGS. 4a to 4c) having a single etching zone covering practically all of the components and trenches enabling an integrated cap to be made (first mechanical layer 1) and the mechanical structure to be made (second mechanical layer 6). This shape corresponds to FIGS. 1a to 1o. When this configuration includes replugging the openings, it can be used for making an inertial structure with an integrated cap. Otherwise, the first mechanical layer 1 may also be used for making top electrodes. The electrical connections may be made from the top face of the substrate, directly for the electrodes or the cap, and through pillars of monocrystalline silicon and interconnection of doped polycrystalline silicon for the mechanical portion. This type of connection may also be used in the other configurations.

II) Heterogeneous substrate having an etching zone occupying part of the space of the component thus making it possible to make two elastic MEMS structures 81 and 82 of different thicknesses, one of which extends to the surface and the other of which is buried, the shape of the thick structure 81 being etched prior to releasing the cavities (FIGS. 5a and 5b). Contacts to the shallower mechanical layer may be made through an interconnection layer of silicon placed under and through the sacrificial layer.

III) Heterogeneous substrate having two buried zones 103 and 105 of different thicknesses placed beside each other (FIGS. 6a and 6b) and covering practically all of the components, with trenches 86 and 87 enabling a MEMS component to be made with an integrated cap and two thicknesses for the mechanical structure, e.g. for making two elastic structures 84 and 85 of different thicknesses without a single accelerometer, or else for making two accelerometers on a single component (measuring acceleration in the plane and outside the plane), or for making electrodes on top of the mechanical layer. When the etching zones are made from three layers of SiGe—Si—SiGe, the deep etching of both mechanical layers may be performed simultaneously. Otherwise, it is necessary to use a dry film, beginning with the etching that requires more critical accuracy.

IV) Heterogeneous substrate having two etching zones 91 and 92 of the same thickness in the same plane, and trenches 93 and 94 enabling a MEMS component to be made having two superposed components that are mechanically interconnected (FIGS. 7a and 7b). This configuration may be used for making a mass 97 (thick first mechanical layer 1) that is rigidly connected by the region 97 to a mechanical structure 98 (thin second mechanical layer 6).

V) Heterogeneous substrate having two etching zones 101 and 102 of the same thickness and in the same plane, without trenches, enabling a fine suspended mechanical structure 103 to be made that is associated with a mass 104 (FIGS. 8a and 8b). The sacrificial layer is etched from specific openings.

VI) Heterogeneous substrate identical to V), but either with bonding on cavities so that no etching of the sacrificial layer is required after bonding, or else with release of the mechanical structure by openings 106 made from the rear face of the component (FIGS. 9a and 9b).

What is claimed is:

1. A method of making a component from a heterogeneous substrate comprising first and second portions in at least one monocrystalline material, said first portion having a monocrystalline Si surface and a sacrificial layer constituted by at least one stack of at least one layer of monocrystalline Si situated between two layers of monocrystalline SiGe, one of said SiGe layers being epitaxied on said monocrystalline Si surface of said first portion the stack being disposed between said first and second portions of monocrystalline material, wherein the method comprises etching said stack by making:

e) at least one opening in the first and/or second portion and the first and/or second layer of SiGe so as to reach the layer of Si; and f) eliminating all or part of the layer of Si.

2. A method according to claim 1, including removing all or part of the first and second layers of SiGe.

3. A method according to claim 1, including, between steps e) and f), a step of protecting the flanks of the opening(s) by making a protective layer of oxide.

4. A method according to claim 3, wherein the protective oxide layer is made by thermal oxidation.

5. A method according to claim 1, wherein the second portion is made of at least one second monocrystalline material suitable for being grown epitaxially from monocrystalline SiGe.

6. A method according to claim 1, wherein a said second monocrystalline material is selected from: Si; $SrTiO_3/PZT$; and $SrTiO_3/SrRuO_3/PZT$.

7. A method according to claim 1, wherein said stack includes at least one buried zone.

8. A method according to claim 1, including the following steps of making the heterogeneous substrate from a substrate including a said first portion of monocrystalline material:

a) epitaxially growing a first layer of monocrystalline SiGe on said first portion;

b) epitaxially growing a layer of monocrystalline Si;

c) epitaxially growing a second layer of monocrystalline SiGe; and d) epitaxially growing said second portion of monocrystalline material, at least on the layer grown epitaxially in step c).

9. A method according to claim 8, wherein the first and/or the second layer of SiGe is/are locally etched prior to performing the epitaxial growth in step b) and/or d).

10. A method according to claim 8, wherein, after step b) and before c), trenches are made in the layer of Si as far as the first layer of SiGe.

11. A method according to claim 8, wherein the first and/or the second layer of SiGe has/have thickness lying in the range 40 nm to 150 nm.

* * * * *